(12) United States Patent
Lee et al.

(10) Patent No.: US 7,999,579 B2
(45) Date of Patent: Aug. 16, 2011

(54) OUTPUT DRIVER

(75) Inventors: Hyung-Dong Lee, Gyeonggi-do (KR);
Dong-Hwee Kim, Gyeonggi-do (KR);
Hwa-Yong Yang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 98 days.

(21) Appl. No.: 12/165,154

(22) Filed: Jun. 30, 2008

(65) Prior Publication Data

US 2009/0059712 A1 Mar. 5, 2009

(30) Foreign Application Priority Data

Aug. 29, 2007 (KR) .................. 10-2007-0087097

(51) Int. Cl.
*H03B 1/00* (2006.01)
*H03K 3/00* (2006.01)
(52) U.S. Cl. ........................... 327/112; 327/108
(58) Field of Classification Search .............. 327/108, 327/112; 326/26, 27
See application file for complete search history.

(56) References Cited

U.S. PATENT DOCUMENTS

| 6,037,803 | A | 3/2000 | Klein | |
|---|---|---|---|---|
| 6,653,878 | B2 * | 11/2003 | Nolan | 327/170 |
| 7,030,670 | B2 * | 4/2006 | Lin | 327/170 |

FOREIGN PATENT DOCUMENTS

| JP | 2002-367376 | 12/2002 |
|---|---|---|
| KR | 1020040010288 | 1/2004 |
| KR | 1020050088862 A | 9/2005 |

OTHER PUBLICATIONS http://www.merriam-webster.com/dictionary/some, definition of "some".*
http://www.merriam-webster.com/dictionary/some, definition of "some" Oct. 22, 2010.*
Foreign Office Action issued on Oct. 9, 2008 in the corresponding KR application 10-2007-0087097 with an English translation.
Notice of Allowance issued from Korean Intellectual Property Office on Mar. 23, 2009.

* cited by examiner

*Primary Examiner* — Lincoln Donovan
*Assistant Examiner* — Diana J Cheng
(74) *Attorney, Agent, or Firm* — IP & T Group LLP (57) ABSTRACT

An output driver is applicable to two or more interface standards. The output driver includes a pre-driver configured to generate pull-up control signals and pull-down control signals according to a logic value of data to be output and a target resistance, and adjust slew rates of the pull-up control signals and the pull-down control signals according to operation modes, and a driver configured to output the data in response to the pull-up and pull-down control signals.

5 Claims, 7 Drawing Sheets

OUTPUT DRIVER

CROSS-REFERENCE TO RELATED APPLICATION

The present invention claims priority of Korean patent application number 10-2007-0087097, filed on Aug. 29, 2007, which is incorporated by reference in its entirety.

BACKGROUND OF THE INVENTION

The present invention relates to an output driver for outputting data or signals to the outside of a chip in a semiconductor device, and more particularly to an output driver that is capable of meeting a variety of interface standards.

In semiconductor devices, an output driver is used to output stored data or operation results to the outside of a chip. Semiconductor devices may be applied to a variety of systems, each of which may have different interface standards. For example, a dynamic random access memory (DRAM), which is one type of semiconductor memory device, may be applied to a system that uses a Pseudo Open Drain (POD) interface standard, or a system that uses a Low Voltage CMOS (LVCMOS) interface standard. The POD interface and the LVCOS interface are defined in the JEDEC standard.

In this case, the semiconductor memory devices use two types of output drivers, which will be described below.

Figure 1:
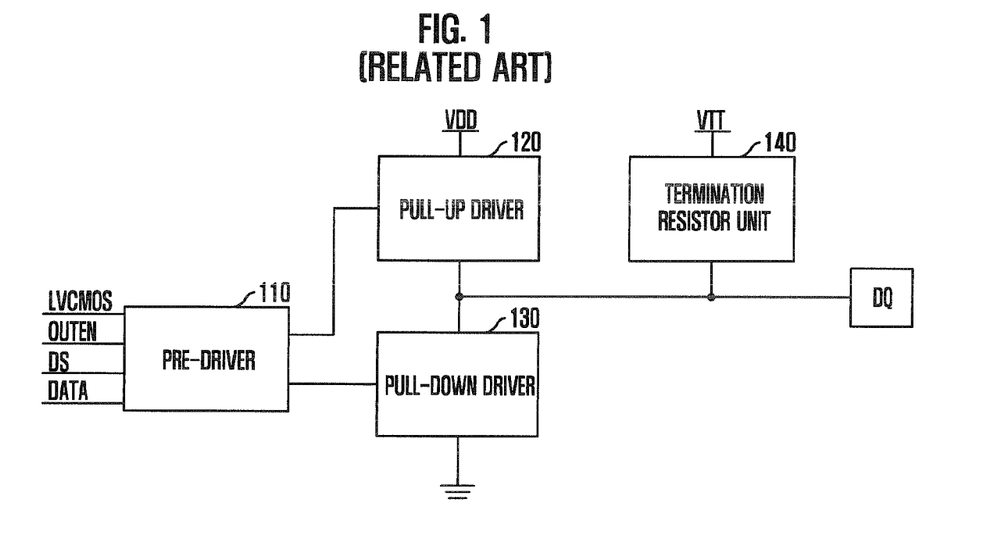
FIG. 1 is a block diagram of an output driver that is applicable to a POD interface standard.

FIG. 1 is a block diagram of an output driver that is applicable to a POD interface standard.

The output driver using the POD interface includes a pre-driver 110, a pull-up driver 120, and a pull-down driver 130. The output driver further includes a termination resistor unit 140 at an input/output pad DQ for data input.

The pre-driver 110 controls the pull-up driver 120 and the pull-down driver 130 to output data DATA. The pre-driver 110 enables the pull-up driver 120 when the data DATA to be output is logic high data, and enables the pull-down driver 130 when the data DATA to be output is logic low data. In addition, the pre-driver 110 determines resistances the pull-up driver 120 and the pull-down driver 130 will have when they are enabled. In FIG. 1, reference symbol "OUTEN" represents an enable signal of the output driver, reference symbol "DS" (driver strength) represents information on target resistance the drivers 120 and 130 must have, and reference symbol "LVCMOS" represents a signal discriminating an LVCMOS mode and a POD mode. When activated, the signal indicates the LVCMOS mode; and when deactivated, the signal indicates the POD mode.

The pull-up driver 120 includes a number of resistors connected in parallel. The pull-up driver 120 is enabled to terminate the output pad DQ to a pull-up voltage level and outputs the logic high data. Whether to enable the pull-up driver 120 and which resistor of the parallel resistors is to be turned on are determined under the control of the pre-driver 110.

The pull-down driver 130 includes a number of resistors connected in parallel. The pull-down driver 130 is enabled to terminate the output node DQ to a pull-down voltage level and outputs the logic low data. Whether to enable the pull-down driver 130 and which resistor of the parallel resistors is to be turned on are determined under the control of the pre-driver 110.

Upon receipt of data on the basis of the POD interface standard, the termination resistor unit 140 is turned on to terminate the input/output pad DQ. The termination resistor unit 140 is related to only the data input, and it is not the element of the output driver. When data is received on the basis of the POD interface standard, the termination resistor unit 140 is turned on and data is input with an adjusted swing width. This portion is not shown in the drawing. Since the pull-up driver 120 can function to terminate the input/output pad DQ, it may perform the function of the termination resistor unit 140 at the same time according to systems to which the output driver is applied.

Figure 2:
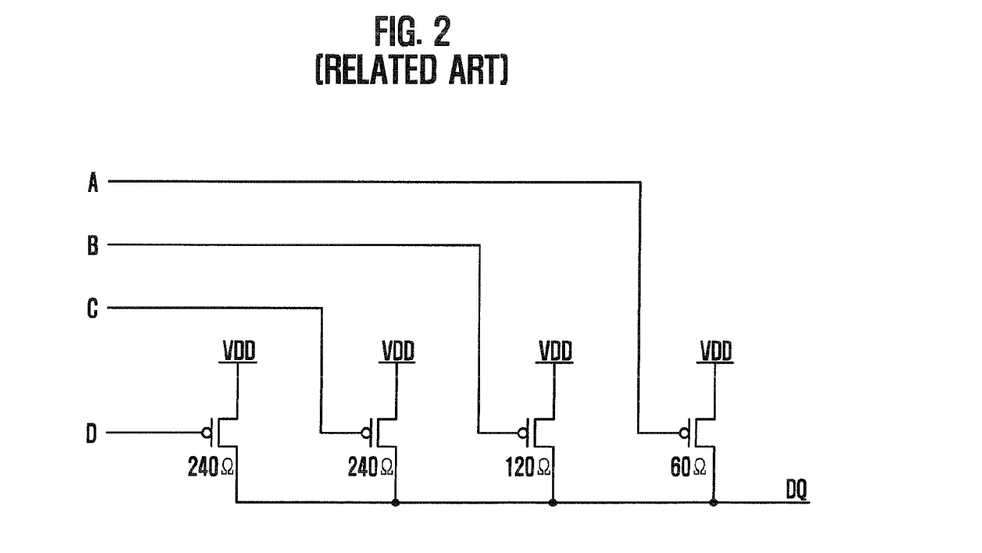
FIG. 2 is a circuit diagram of a pull-up driver (120) of FIG. 1.

FIG. 2 is a circuit diagram of the pull-up driver 120 of FIG. 1.

Referring to FIG. 2, the pull-up driver 120 includes a number of parallel resistors that are turned on/off in response to output signals A, B, C and D of the pre-driver 110.

When the signals A, B, C and D are all activated to a low level, a total resistance of the parallel resistors (240Ω, 240Ω, 120Ω, 60Ω) is equal to 30Ω. As a result, the pull-up driver 120 meets the target resistance of 30Ω. If the target resistance is 40Ω, only the signals A and B are activated and the pull-up driver 120 meets the target resistance. Also, the pull-up driver 120 meets the target resistance of 50Ω when the signals A and C are activated.

Like the pull-up driver 120, the pull-down driver 130 may include a plurality of parallel resistors. However, in contrast to the pull-up driver 120, the pull-down driver 130 is implemented with NMOS transistors as the parallel resistors.

Figure 3:
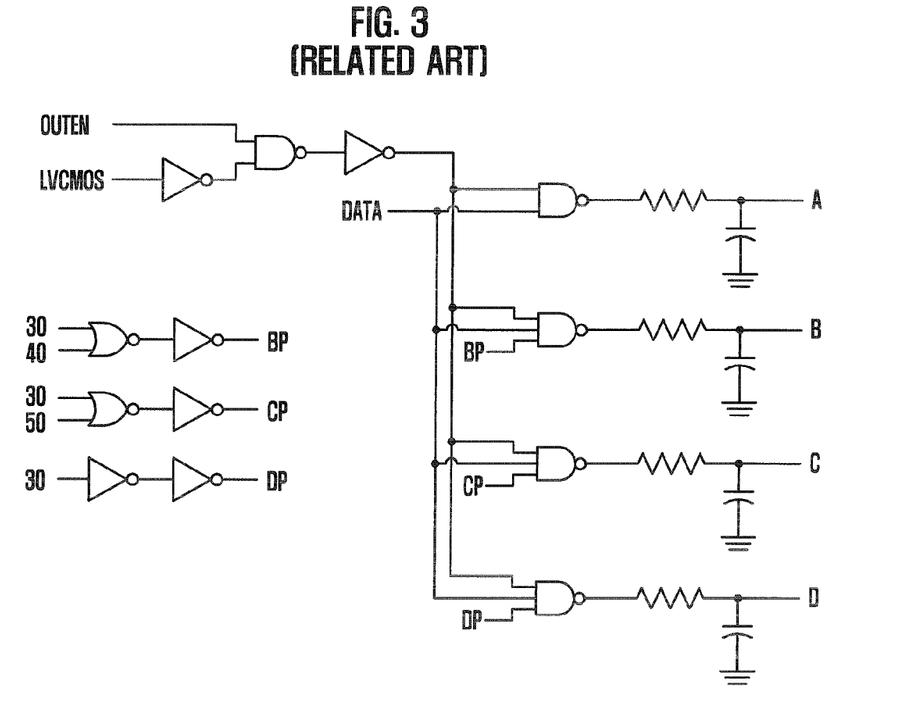
FIG. 3 is a circuit diagram of a pre-driver (110) of FIG. 1.

FIG. 3 is a circuit diagram of the pre-driver 110 of FIG. 1.

The structure for controlling the pull-up driver 120 is illustrated in FIG. 3, while the structure for controlling the pull-down driver 130 is omitted. Although not illustrated, the circuit of the pre-driver 110 for controlling the pull-down driver 130 may be configured with the same structure as that shown in FIG. 3, except that logic states of several signals are opposite to those in FIG. 3.

The pre-driver 110 operates when the enable signal OUTEN is activated and the signal LVCMOS is deactivated, that is, in the POD mode. Reference numerals 30, 40 and 50 represent signals that are activated when the target resistance is 30Ω, 40Ω and 50Ω, respectively. These signals 30, 40 and 50 are denoted by the reference symbol "DS" in FIG. 1.

The pre-driver 110 activates the signals A, B, C and D when data to be output is logic high data and the target resistance is 30Ω, and activates the signals A and B when data to be output is logic high data and the target resistance is 40Ω. Also, the pre-driver 110 activates the signals A and C when data to be output is logic high data and the target resistance is 50Ω.

Using RC delays of resistors and capacitors provided at output terminals of the signals A, B, C and D, slew rates of the signals A, B, C and D driving the pull-up driver 120 are adjusted to meet the POD interface standard.

Figure 4:
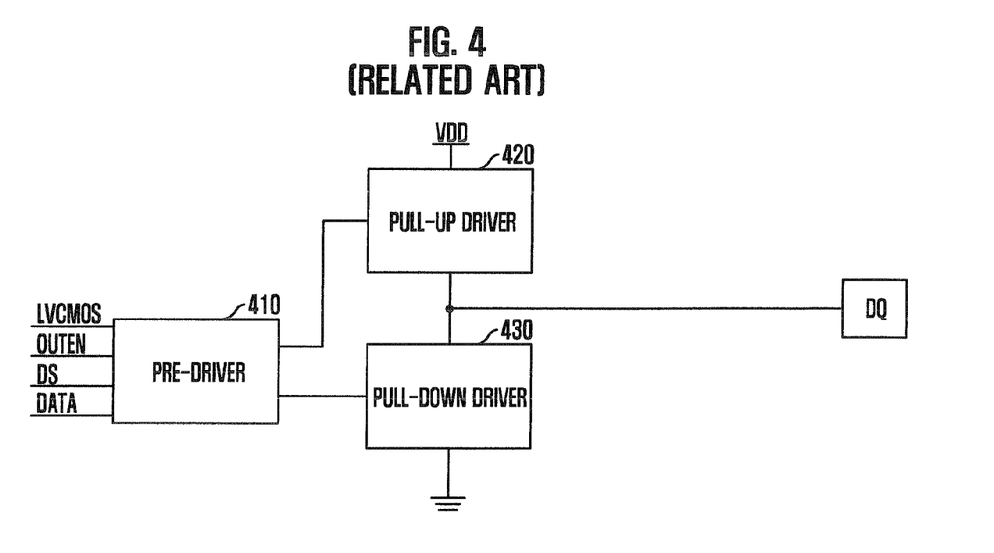
FIG. 4 is a block diagram of an output driver that is applicable to an LVCMOS interface standard.

FIG. 4 is a block diagram of an output driver that is applicable to an LVCMOS interface standard.

The output driver using the LVCMOS includes a pre-driver 410 and a pull-down driver 430. The output driver does not include a termination resistor unit 140 of FIG. 1 even upon data input.

The pre-driver 410 controls the pull-up driver 420 and the pull-down driver 430 to output data DATA. The pre-driver 410 enables the pull-up driver 420 when the data DATA to be output is logic high data, and enables the pull-down driver 430 when the data DATA to be output is logic low data. In addition, the pre-driver 410 determines resistances the pull-up driver 420 and the pull-down driver 430 will have when they are enabled. In FIG. 4, a reference symbol "OUTEN" represents an enable signal of the output driver, a reference symbol "DS" (driver strength) represents information on target resistance the drivers 420 and 430 must have, and a reference symbol "LVCMOS" represents a signal discriminating an LVCMOS mode and a POD mode. When activated, the signal indicates the LVCMOS mode; and when deactivated, the signal indicates the POD mode.

The pull-up driver 420 includes a plurality of resistors connected in parallel. The pull-up driver 420 is enabled to terminate the output pad DQ to a pull-up voltage level and outputs the logic high level data. Whether to enable the pull-up driver 420 and which resistor of the parallel resistors is to be turned on are determined under the control of the pre-driver 410.

The pull-down driver 430 includes a plurality of resistors connected in parallel. The pull-down driver 430 is enabled to terminate the output node DQ to a pull-down voltage level and outputs the logic low level data. Whether to enable the pull-down driver 430 and which resistor of the parallel resistors is to be turned on are determined under the control of the pre-driver 410.

Figure 5:
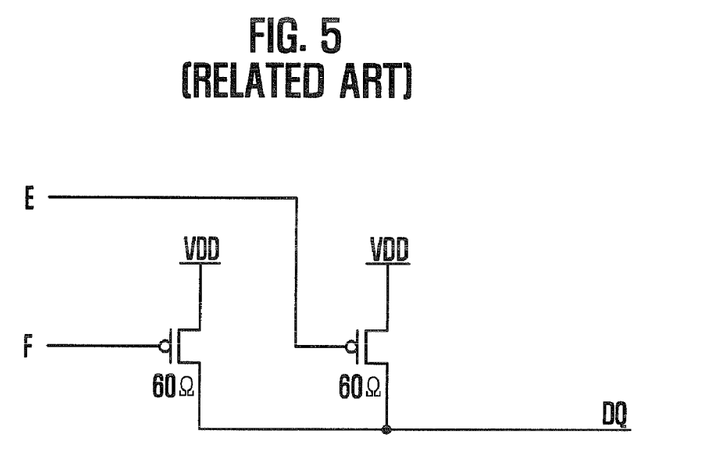
FIG. 5 is a circuit diagram of a pull-up driver (420) of FIG. 1.

FIG. 5 is a circuit diagram of the pull-up driver 420 of FIG. 1.

Referring to FIG. 5, the pull-up driver 420 includes a plurality of parallel resistors that are turned on/off in response to output signals E and F of the pre-driver 410.

When the signals E and F are activated to a low level, a total resistance of the parallel resistors (60Ω, 60Ω) is equal to 30Ω. As a result, the pull-up driver 420 meets the target resistance of 30Ω. The pull-up driver 420 meets the target resistance of 60Ω when the signal E is activated.

Like the pull-up driver 420, the pull-down driver 430 may include a plurality of parallel resistors. However, the parallel resistors of the pull-down driver 430 are implemented with NMOS transistors, as opposed to the pull-up driver 420.

Figure 6:
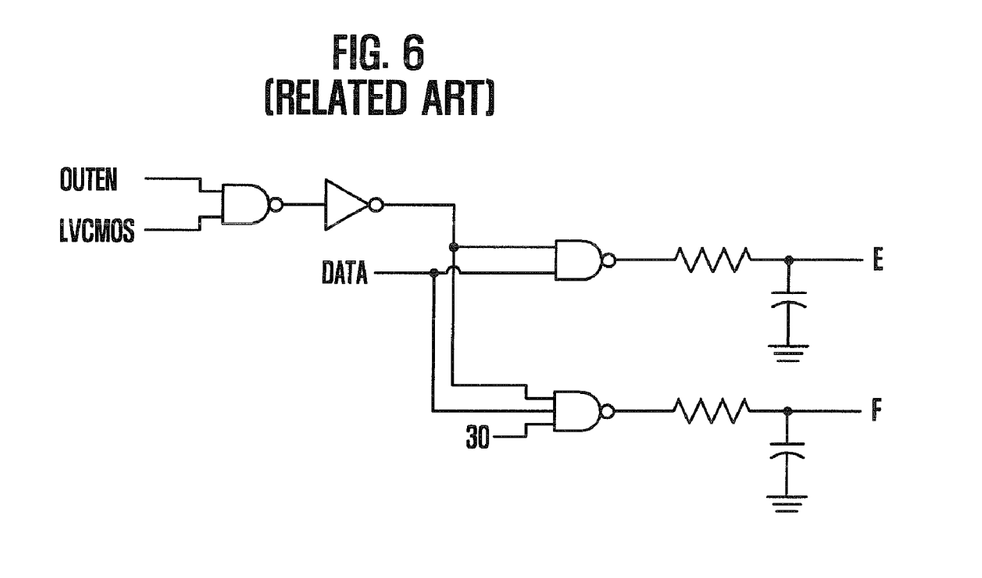
FIG. 6 is a circuit diagram of a pre-driver (410) of FIG. 4.

FIG. 6 is a circuit diagram of the pre-driver 410 of FIG. 4.

A part for controlling the pull-up driver 420 is illustrated in FIG. 3, while a part for controlling the pull-down driver 430 is omitted. Although not illustrated, the circuit of the pre-driver 410 for controlling the pull-down driver 430 may be configured in the same structure as that of FIG. 6, except that logic states of several signals are opposite to those of FIG. 6.

The pre-driver 410 operates when the enable signal OUTEN is activated and the signal LVCMOS is activated, that is, in the LVCMOS mode. A reference numeral 30 represents a signal that is activated when the target resistance is 30Ω. This signal is denoted by the reference symbol "DS" in FIG. 4.

The pre-driver 410 activates the signals E and F when data to be output is logic high data and the target resistance is 30Ω, and activates the signal E when data to be output is logic high data and the target resistance is 60Ω.

Using RC delays of resistors and capacitors provided at output terminals of the signals E and F, slew rates of the signals E and F driving the pull-up driver 420 are adjusted to meet the LVCMOS interface standard.

The conventional semiconductor memory device applicable to the POD interface standard and the LVCMOS interface standard includes the output drivers of FIGS. 1 and 4 at the data output terminal DQ in order to meet two types of interface standards each of which has a different target resistance and slew rate. In this case, the circuit area of the semiconductor memory device increases, and such a structure is problematic in the trends that the number of I/O pins (DQ pins) gradually increases.

SUMMARY OF THE INVENTION

Embodiments of the present invention are directed to providing an output driver applicable to two or more interface standards.

In accordance with an aspect of the invention, there is provided an output driver, which includes a pre-driver configured to generate pull-up control signals and pull-down control signals according to a logic value of data to be output and a target resistance, and adjust slew rates of the pull-up control signals and the pull-down control signals according to operation modes, and a driver configured to output the data in response to the pull-up and pull-down control signals.

In accordance with another aspect of the invention, there is provided a semiconductor memory device, which includes an output driver for outputting data by adjusting a slew rate according to operation modes to be applied to various input/output requirements, wherein the output driver includes a pre-driver configured to generate pull-up control signals and pull-down control signals, and differently adjust slew rates of the pull-up control signals and the pull-down control signals according to the operation modes, a pull-up driver configured to output the data in response to the pull-up control signals, and a pull-down driver configured to output the data in response to the pull-down control signals.

In accordance with the embodiment of the invention, since the pre-driver adjusts the slew rate of the signal according to the mode, the requirements of the different interface standards can be met by using one output driver.

DESCRIPTION OF SPECIFIC EMBODIMENTS

Hereinafter, an output driver in accordance with the present invention will be described in detail with reference to the accompanying drawings.

Figure 7:
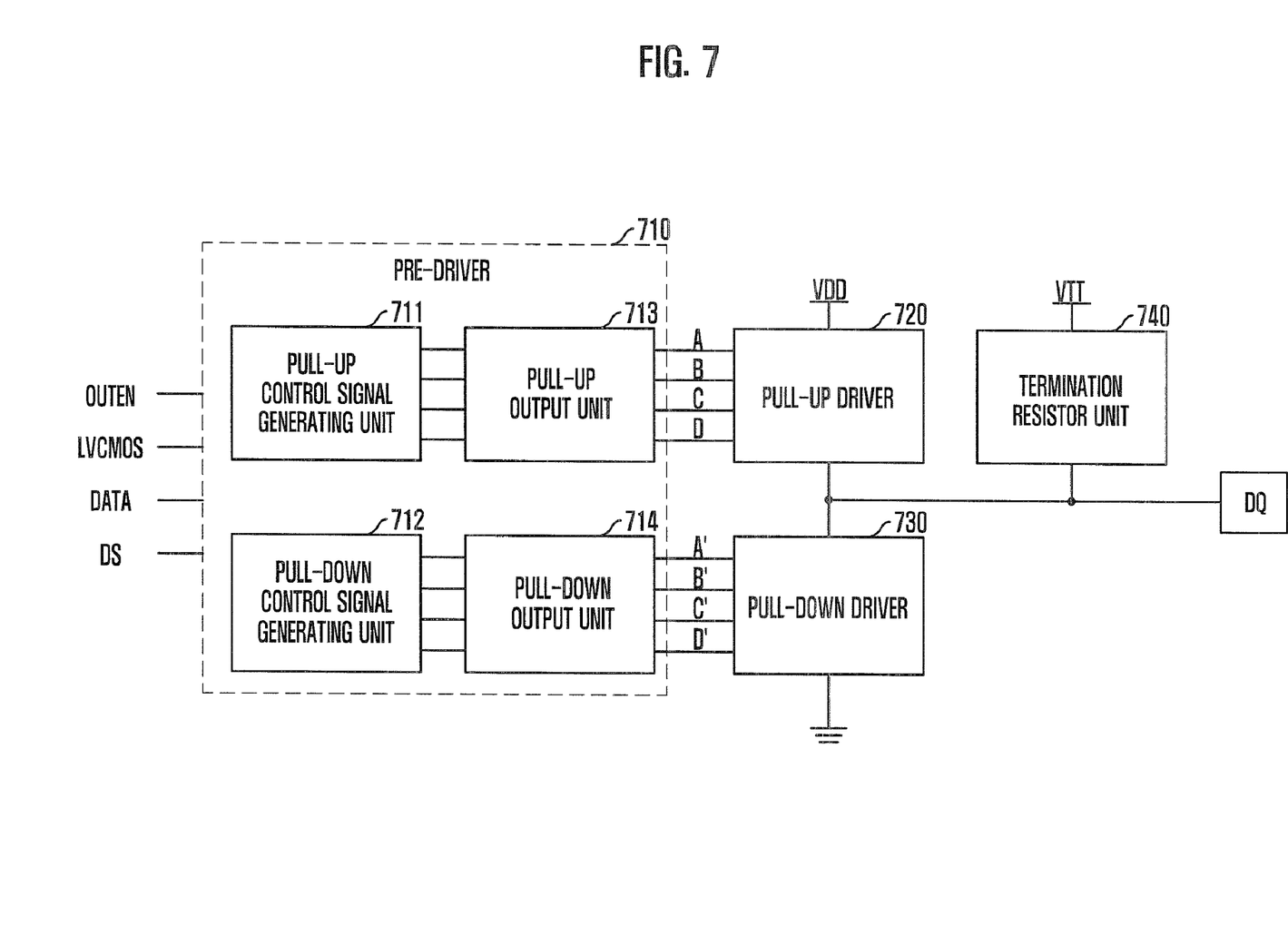
FIG. 7 is a block diagram of an output driver in accordance with an embodiment of the present invention.

FIG. 7 is a block diagram of an output driver in accordance with an embodiment of the invention.

Referring to FIG. 7, the output driver includes a pre-driver 710, a pull-up driver 720, and a pull-down driver 730. The pre-driver 710 generates pull-up control signals A, B, C and D and pull-down control signals A', B', C' and D' according to a logic value of data DATA to be output and a target resistance DS, and adjusts slew rates of the pull-up control signals A, B, C and D and the pull-down control signals A', B', C' and D' according to a first mode and a second mode. The pull-up driver 720 outputs a high data, i.e., logic high data, in response to the pull-up control signals A, B, C and D, and the pull-down driver 730 outputs a low data, i.e., logic low data, in response to the pull-down control signals A', B', C' and D'.

The pre-driver 710 may include a pull-up control signal generating unit 711, a pull-down control signal generating unit 712, a pull-up output unit 713, and a pull-down output unit 714. The pull-up control signal generating unit 711 generates the pull-up control signals A, B, C and D that are activated according to the target resistance DS when the data DATA is a high data. The pull-down control signal generating unit 712 generates the pull-down control signals A', B', C' and D' that are activated according to the target resistance DS when the data DATA is a low data. The pull-up output unit 713 adjusts the slew rates of the pull-up control signals A, B, C and D according to the first mode and the second mode. The pull-down output unit 714 adjusts the slew rates of the pull-down control signals A', B', C' and D' according to the first mode and the second mode.

The conventional semiconductor device includes two types of output drivers in order to meet two or more interface standards. This is because each interface standard has a different slew rate and target resistance. In accordance with the invention, however, the pre-driver adjusts the slew rate of the signal according to the first mode and the second mode and thus the output driver is applicable to different interface standards. It is possible to cope with a difference of the target resistance between two interfaces by increasing the target resistance supported by the output driver.

The first mode and the second mode refer to modes where the output driver operates in compliance with different interface standards. It is assumed that the first mode refers to a mode where the output driver operates in compliance with a PDO interface standard, and the second mode refers to a mode where the output driver operates in compliance with an LVCMOS interface standard.

Upon receipt of data on the basis of the POD interface standard, a termination resistor unit 740 is turned on to terminate the input/output pad DQ. In the POD mode, data is input through a data input circuit (not shown) when the termination resistor unit 740 is in on-state. Since the termination resistor unit 740 has no direct relation to the output driver, detailed description thereof will be omitted.

Figure 8:
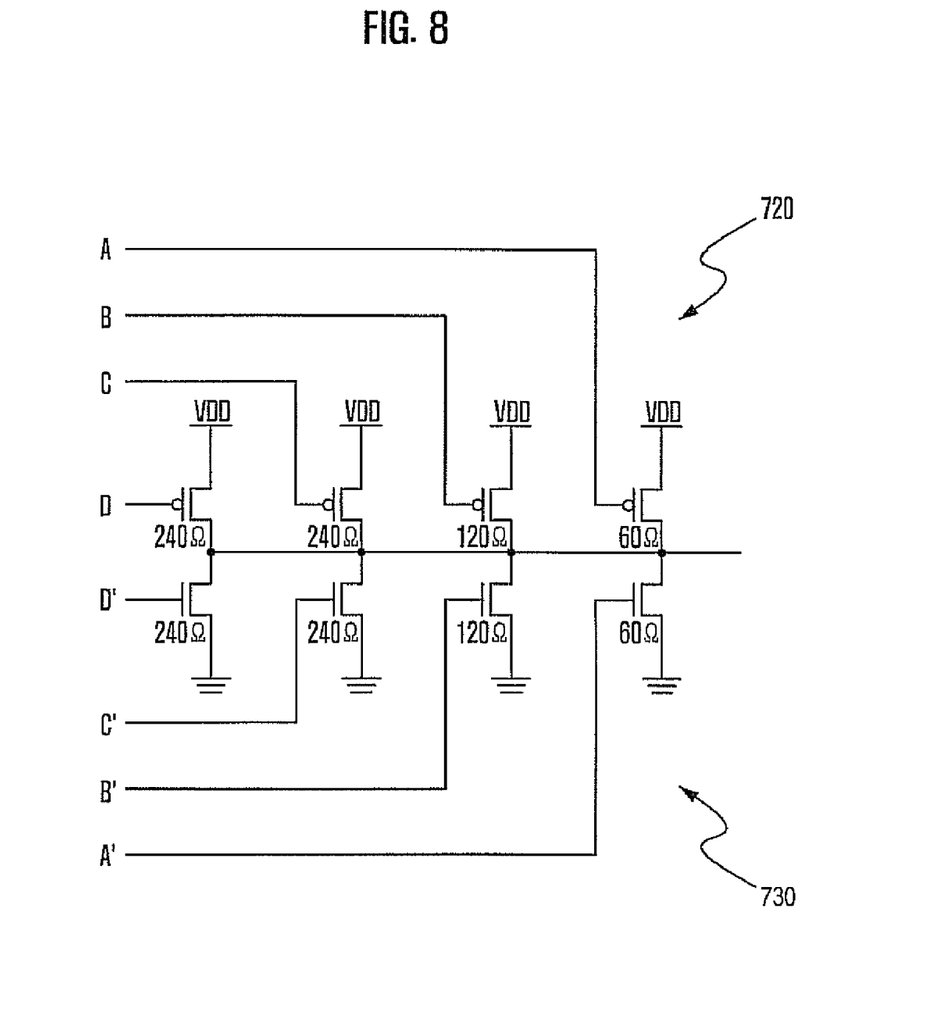
FIG. 8 is a circuit diagram of a pull-up driver (720) and a pull-down driver (730) of FIG. 7.

FIG. 8 is a circuit diagram of the pull-up driver 720 and the pull-down driver 730 of FIG. 7.

Referring to FIG. 8, the pull-up driver 720 includes a plurality of parallel resistors that are turned on/off in response to the pull-up control signals A, B, C and D. The pull-up driver 720 can have target resistances of 30Ω, 40Ω, 50Ω and 60Ω. That is, the pull-up driver 720 can have the target resistances (30Ω, 40Ω, 50Ω) required in the POD interface standard, and the target resistances (30Ω, 60Ω) required in the LVCMOS interface standard.

Specifically, when the pull-up control signals A, B, C and D are all activated to a low level, a total resistance of the parallel resistors (240Ω, 240Ω, 120Ω, 60Ω) in the pull-up driver 720 is equal to 30Ω. As a result, the pull-up driver 720 meets the target resistance of 30Ω. The pull-up driver 720 meets the target resistance of 40Ω when the signals A and B are activated. The pull-up driver 720 meets the target resistance of 50Ω when the signals A and C are activated. Also, the pull-up driver 720 meets the target resistance of 60Ω when only the signal A is activated.

That is, the pull-up driver 720 has the resistance determined by the pull-up control signals A, B, C and D and terminates the output node (in the case of the memory device, a node connected to the DQ pin) to a pull-up voltage level to output the high data.

The pull-down driver 730 includes a plurality of parallel resistors that are turned on/off in response to the pull-down control signals A', B', C' and D'. Since the pull-down driver 730 must terminate the output node DQ to a pull-down voltage level, they are implemented with NMOS transistors, as opposed to the pull-up driver 720.

When the pull-down control signals A', B', C' and D' are all activated to a high level, a total resistance of the parallel resistors (240Ω, 240Ω, 120Ω, 60Ω) in the pull-down driver 730 is equal to 30Ω. As a result, the pull-down driver 730 meets the target resistance of 30Ω. The pull-down driver 730 meets the target resistance of 40Ω when the signals A' and B' are activated. The pull-down driver 730 meets the target resistance of 50Ω when the signals A' and C' are activated. Also, the pull-down driver 730 meets the target resistance of 60Ω when only the signal A' is activated.

That is, the pull-down driver 730 has the resistance determined by the pull-down control signals A', B', C' and D' and terminates the output node (in the case of the memory device, a node connected to the DQ pin) to a pull-down voltage level to output the low data.

Figure 9:
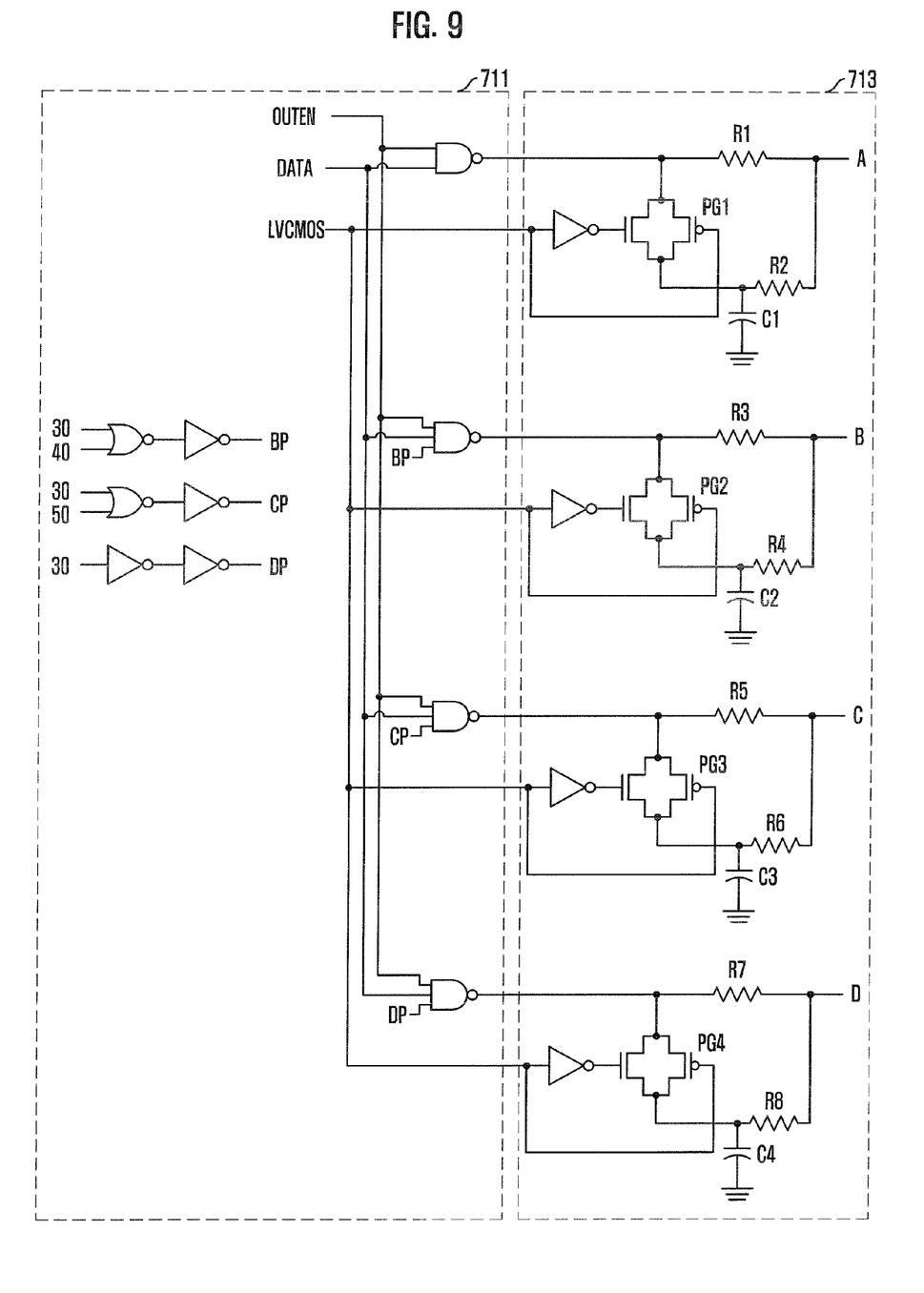
FIG. 9 is a circuit diagram of a pull-up control signal generating unit (711) and a pull-up output unit (713) in a pre-driver (710)

FIG. 9 is a circuit diagram of the pull-up control signal generating unit 711 and the pull-up output unit 713 in the pre-driver 710, which are related to the pull-up driver 720.

When the data is the high data, the pull-up control signal generating unit 711 generates the pull-up control signals A, B, C and D that are activated according to the target resistance DS (specifically, the signals 30, 40 and 50). When the data to be output is the high data and the target resistance is 30Ω, that is, the signal 30 is activated, the pull-up control signal generating unit 711 activates the pull-up control signals A, B, C and D to a low level, so that the pull-up driver 720 has the resistance of 30Ω. The pull-up control signal generating unit 711 activates the pull-up control signals A and B to a low level when the target resistance is 40Ω, that is, the signal 40 is activated. The pull-up control signal generating unit 711 activates the pull-up control signals A and C to a low level when the target resistance is 50Ω, that is, the signal 50 is activated. Also, when the target resistance is 60Ω, that is, the signals 30, 40 and 50 are all deactivated, the pull-up control signal generating unit 711 activates the pull-up control signal A to a low level. In this way, the pull-up driver 720 has the required resistances.

The pull-up output unit 713 adjusts the slew rates of the pull-up control signals A, B, C and D according to the first mode, where the output driver operates in compliance with the POD interface standard, and the second mode, where the output driver operates in compliance with the LVCMOS interface standard. The adjustment of the slew rates can be achieved by varying the delay values of the pull-up control signals A, B, C and D. RC delays may be used to vary the delay values.

As illustrated, the pull-up output unit 713 for adjusting the slew rates of the pull-up control signals includes resistors R1 to R8 and capacitors C1 to C4. Also, the pull-up output unit 713 further includes switching units PG1 to PG4 for changing RC delay values determined by the resistors R1 to R8 and the capacitors C1 to C4 according to the first mode and the second mode. Pass gates may be used as the switching units PG1 to PG4. The pass gates are turned on/off in response to the LVCMOS signal that is activated in the LVCMOS mode (the first mode) and deactivated in the POD mode (the second mode). The RC delay values are varied according to the turning on/off of the pass gates.

Referring to FIG. 9, the switching units PG1 to PG4 are turned on/off in response to the first mode (the LVCMOS signal is activated) and the second mode (the LVCMOS signal is deactivated). The switching units PG1 to PG4 connect or disconnect the resistors R1 to R8 disposed on both either side of the switching units PG1 to PG4, and the component values are varied. However, it is apparent that the pull-up output unit 713 can be designed to vary the RC delay values in various manners. For example, the pull-up output unit 713 may be designed such that the switching units PG1 to PG4 are turned on/off to vary the component values of either or both of the resistors R1 to R8 and the capacitors C1 to C4.

Figure 10:
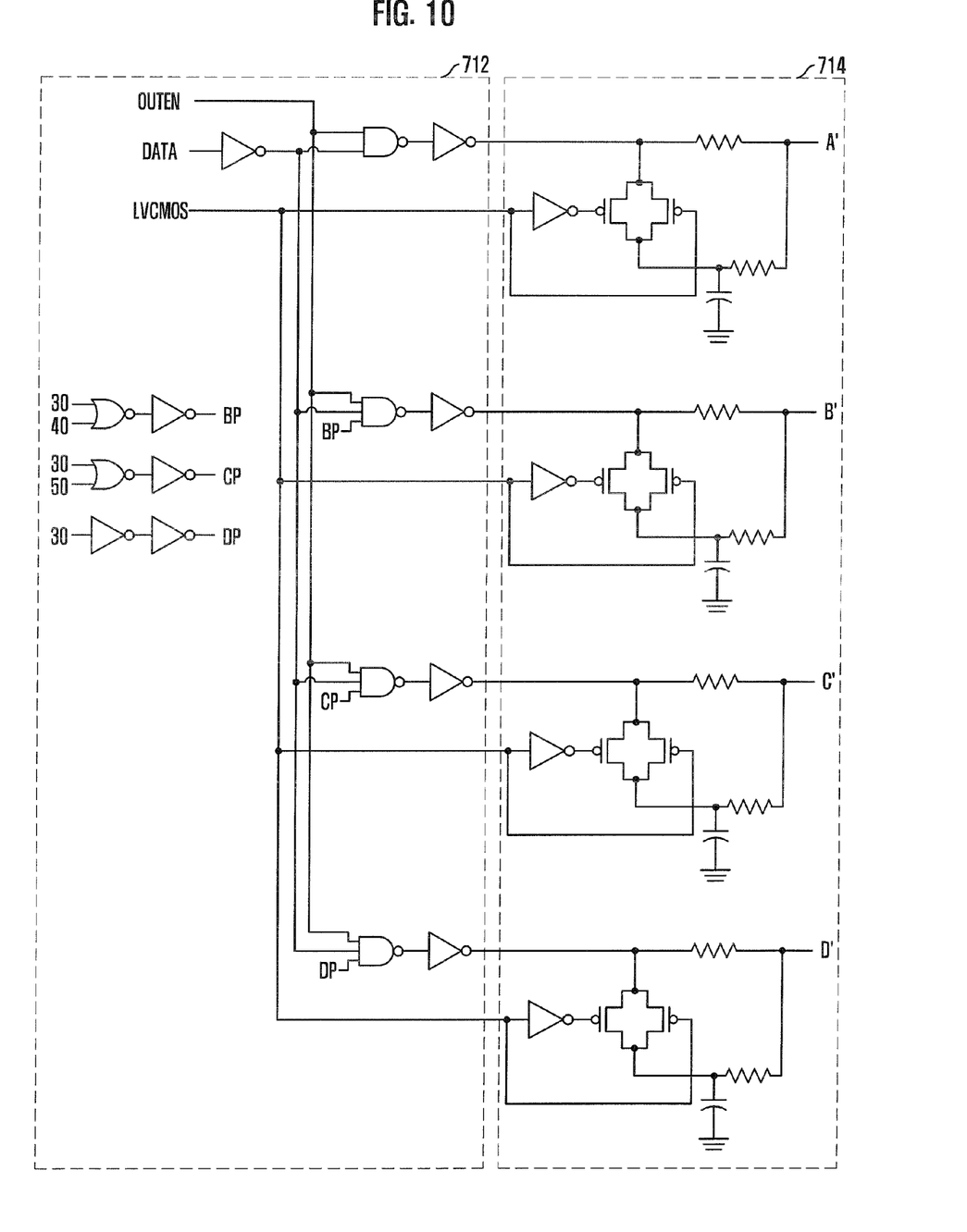
FIG. 10 is a circuit diagram of a pull-down control signal generating unit (712) and a pull-down output unit (714) in the pre-driver (710)

FIG. 10 is a circuit diagram of the pull-down control signal generating unit 712 and the pull-down output unit 714 in the pre-driver 710, which are related to the pull-down driver 730.

When the data is the low data, the pull-down control signal generating unit 712 generates the pull-down control signals A', B', C' and D' that are activated according to the target resistance DS (specifically, the signals 30, 40 and 50). When the data to be output is the low data and the target resistance is 30Ω, that is, the signal 30 is activated, the pull-down control signal generating unit 712 activates the pull-down control signals A', B', C' and D' to a high level, so that the pull-down driver 730 has the resistance of 30Ω. The pull-down control signal generating unit 712 activates the pull-down control signals A' and B' to a high level when the target resistance is 40Ω, that is, the signal 50 is activated. The pull-down control signal generating unit 712 activates the pull-down control signals A' and C' to a high level when the target resistance is 50Ω, that is, the signal 50 is activated. Also, when the target resistance is 60Ω, that is, the signals 30, 40 and 50 are all deactivated, the pull-down control signal generating unit 712 activates the pull-down control signal A' to a high level. In this way, the pull-down driver 730 has the required resistances.

That is, the pull-down control signal generating unit 712 differs from the pull-up control signal generating unit 713 in that the pull-down control signals A', B', C' and D' are activated to the high level when the data to be output is the low data.

The pull-down output unit 714 adjusts the slew rates of the pull-down control signals A', B', C' and D' according to the first mode, where the output driver operates in compliance with the POD interface standard, and the second mode, where the output driver operates in compliance with the LVCMOS interface standard. The adjustment of the slew rates can be achieved by varying the delay values of the pull-down control signals A', B', C' and D'. RC delays may be used to vary the delay values.

The only difference between the pull-down output unit 714 and the pull-up output unit 713 is that the targets to adjust the slew rates are the pull-down control signals A', B', C' and D', and thus detailed description of the pull-down output unit 714 will be omitted.

The output driver in accordance with the embodiment of the invention can appropriately adjust the slew rates of the control signals according to the first mode and the second mode. Therefore, the output driver can be applied to the interfaces requiring different slew rates. This means the reduction in the circuit area of the semiconductor device including the output driver.

As described above, the pre-driver of the output driver adjusts the slew rates of the signals according to the first mode (e.g., the POD mode) and the second mode (e.g., the LVCMOS mode). Thus, requirements of the different interface standards can be met by using one output driver.

The number of the output driver need not increase even when the semiconductor device supports different interface standards, and the circuit area of the semiconductor device can be remarkably reduced.

While the invention has been described with respect to the specific embodiments, it will be apparent to those skilled in the art that various changes and modifications may be made without departing from the spirit and scope of the invention as defined in the following claims.

Although it has been described above that the output driver adjusts the slew rates according to the first mode and the second mode, it is apparent that the output driver can be designed to adjust the slew rates according to a third mode and a fourth mode.

What is claimed is:

1. An output driver for two different interface standards, comprising:
    a pull-up control signal generating unit configured to activate pull-up control signals according to a target resistance when data to be output is a logic high data, wherein the target resistance corresponds to an interface standard selected among the two different interface standards;
    a pull-down control signal generating unit configured to activate pull-down control signals according to the target resistance when the data to be output is a logic low data;
    a pull-up output unit configured to adjust a slew rate of the pull-up control signals by varying a value of a delay used for generating the pull-up control signals according to mode information indicating the interface standard selected among the two different interface standards, wherein the pull-up output unit comprises first resistors and first capacitors configured to adjust the slew rate of the pull-up control signals and further comprises a first switching unit configured to be turned on/off according to the mode information for selectively switching on a connection between one of the first resistors to one of the first capacitors;
    a pull-down output unit configured to adjust a slew rate of the pull-down control signals by varying a value of a delay used for generating the pull-down control signals according to the mode information, wherein the pull-down output unit comprises second resistors and second capacitors configured to adjust the slew rate of the pull-down control signals and further comprises a second switching unit configured to be turned on/off according to the mode information for selectively switching on a connection between one of the second resistors to one of the second capacitors; and
    a driver configured to output the data in response to the pull-up and pull-down control signals.

2. The output driver as recited in claim 1, wherein the mode information indicates one of a first mode where the output driver operates in compliance with a Pseudo Open Drain (POD) interface standard and a second mode where the output driver operates in compliance with a Low Voltage CMOS (LVCMOS) interface standard.

3. The output driver as recited in claim 1, wherein the driver includes:
    a pull-up driver configured to output the logic high data in response to the pull-up control signals; and
    a pull-down driver configured to output the logic low data in response to the pull-down control signals.

4. The output driver as recited in claim 3, wherein the pull-up driver outputs the logic high data by terminating a data output node to a pull-up voltage level, and the pull-down driver outputs the logic low data by terminating the data output node to a pull-down voltage level, wherein the data output node is connected to outside of a chip.

5. The output driver as recited in claim 4, wherein the output driver is applied to a semiconductor memory device and the data output node is a node connected to a DQ pin of the semiconductor memory device.

* * * * *